US012382777B2

(12) United States Patent
Forrest et al.

(10) Patent No.: US 12,382,777 B2
(45) Date of Patent: Aug. 5, 2025

(54) ORGANIC LIGHT EMITTING DIODE HAVING A MIXED BLOCKING LAYER

(71) Applicant: The Regents of the University of Michigan, Ann Arbor, MI (US)

(72) Inventors: Stephen Forrest, Ewing, NJ (US); Caleb Coburn, Ewing, NJ (US); Jaesang Lee, Ewing, NJ (US)

(73) Assignee: The Regents of the University of Michigan

( * ) Notice: Subject to any disclaimer, the term of this patent is extended or adjusted under 35 U.S.C. 154(b) by 239 days.

(21) Appl. No.: 15/290,584

(22) Filed: Oct. 11, 2016

(65) Prior Publication Data

US 2017/0104172 A1   Apr. 13, 2017

Related U.S. Application Data

(60) Provisional application No. 62/240,298, filed on Oct. 12, 2015.

(51) Int. Cl.
| | | |
|---|---|---|
| H01L 51/50 | (2006.01) | |
| H10K 50/11 | (2023.01) | |
| H10K 50/15 | (2023.01) | |
| H10K 50/16 | (2023.01) | |
| H10K 50/18 | (2023.01) | |
| H10K 85/30 | (2023.01) | |
| H10K 85/40 | (2023.01) | |
| H10K 85/60 | (2023.01) | |
| H10K 101/10 | (2023.01) | |
| H10K 101/30 | (2023.01) | |
| H10K 101/40 | (2023.01) | |

(52) U.S. Cl.
CPC ............ *H10K 50/11* (2023.02); *H10K 50/15* (2023.02); *H10K 50/16* (2023.02); *H10K 50/18* (2023.02); *H10K 85/30* (2023.02); *H10K 85/324* (2023.02); *H10K 85/40* (2023.02); *H10K 85/626* (2023.02); *H10K 85/633* (2023.02); *H10K 85/6572* (2023.02); *H10K 2101/10* (2023.02); *H10K 2101/30* (2023.02); *H10K 2101/40* (2023.02)

(58) Field of Classification Search
None
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 7,279,704 B2 | 10/2007 | Walters et al. |
| 7,431,968 B1 | 10/2008 | Shtein et al. |
| 7,968,146 B2 | 6/2011 | Wanger et al. |
| 2003/0230980 A1 | 12/2003 | Forrest et al. |
| 2004/0174116 A1 | 9/2004 | Lu et al. |
| 2006/0093856 A1* | 5/2006 | Helber ............... C07C 211/54 428/690 |
| 2007/0241676 A1* | 10/2007 | Park .................. H01L 51/5096 313/506 |
| 2007/0252516 A1* | 11/2007 | Kondakova ......... H01L 51/5016 313/504 |
| 2009/0236973 A1* | 9/2009 | Yabe ................... C07D 401/14 546/276.7 |
| 2010/0314613 A1* | 12/2010 | Kitamura ............ H01L 51/0085 257/40 |
| 2013/0026452 A1 | 1/2013 | Kottas et al. |
| 2013/0119354 A1 | 5/2013 | Ma et al. |

FOREIGN PATENT DOCUMENTS

| | | |
|---|---|---|
| EP | 1238981 | 9/2002 |
| JP | 2010135467 | 6/2010 |
| WO | 2004111066 | 12/2004 |
| WO | 2008044723 | 4/2008 |
| WO | 2008057394 | 5/2008 |
| WO | 2010011390 | 1/2010 |
| WO | 2010111175 | 9/2010 |

OTHER PUBLICATIONS

Mulani et al. (RSC Adv. 2013, 3, p. 215).*
Zhang et al. (Nat. Commun. 2014, 5:5008).*
Y. Zhang, J. Lee, S. R. Forrest, "Tenfold increase in the lifetime of blue phosphorescent organic light-emitting diodes", Nature Communications 5, 5008 (2014).
C. Coburn, J. Lee, S.R. Forrest, "Charge Balance and Exciton Confinement in Phosphorescent Organic Light Emitting Diodes", Advanced Optical Materials 4, 889 (2016).
"Measurement of charge balance and its effect on blue electrophosphorescent organic light emitting device lifetime", Caleb Coburn, Jaesang Lee, Stephen R. Forrest, SPIE (2015).
Giebink, N., D'Andrade, Weaver, Mackenzie, Brown, Thompson, & Forrest, "Intrinsic luminance loss in phosphorescent small-molecule organic light emitting devices due to bimolecular annihilation reactions." Journal of Applied Physics, 103(4), (2008).

(Continued)

*Primary Examiner* — Jay Yang

(74) *Attorney, Agent, or Firm* — Riverside Law LLP

(57) ABSTRACT

The present invention relates to mixed blocking layers and devices, such as organic light emitting diodes and other devices, including the same.

17 Claims, 14 Drawing Sheets

(56) References Cited

OTHER PUBLICATIONS

Hajime Nakanotani, Kensuke Masui, Junichi Nishide, Takumi Shibata, & Chihaya Adachi, "Promising operational stability of high-efficiency organic light-emitting diodes based on thermally activated delayed fluorescence.", Scientific Reports, 3(1), 2127. (2013).

Giebink, N., D'Andrade, B., Weaver, M., Brown, J., & Forrest, S. "Direct evidence for degradation of polaron excited states in organic light emitting diodes." Journal of Applied Physics, 105(12) (2009).

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 1, 4-6 (1999).

\* cited by examiner

ORGANIC LIGHT EMITTING DIODE HAVING A MIXED BLOCKING LAYER

STATEMENT REGARDING FEDERALLY SPONSORED RESEARCH OR DEVELOPMENT

This invention was made with government support under Contract No. DE-EE0007077 awarded by the Department of Energy, Office of Energy Efficiency and Renewable Energy (EERE); and contract number FA9550-14-1-0245 awarded by the Air Force Office of Scientific Research. The government has certain rights in this invention.

CROSS-REFERENCE TO RELATED APPLICATIONS

This application is a non-provisional of U.S. Provisional Patent Application Ser. No. 62/240,298, filed Oct. 12, 2015, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to mixed blocking layers and devices, such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

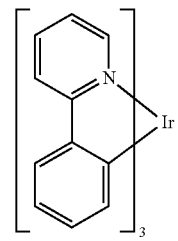

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, on a conventional energy level diagram, with the vacuum level at the top, a "shallower" energy level appears higher, or closer to the top, of such a diagram than a "deeper" energy level, which appears lower, or closer to the bottom.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

There is a need in the art to addressing the problem of exciton leakage and/or charge leakage out of the emissive region of an organic light emitting diode. More specifically, there is a need in the art for blocking layer for addressing these problems, while improving exciton confinement to the emissive region (EML), device efficiency, and operational stability of the device. This invention fulfills these needs.

SUMMARY OF THE INVENTION

In one aspect, the invention relates to an organic light emitting device comprising: a cathode, an anode, and an organic layer therebetween; wherein the organic layer further comprises: a light emission layer comprising an emissive material; and a blocking layer comprising a blocking material and a transport material. In one embodiment, the blocking material has a triplet exciton energy greater than that of the emissive material. In another embodiment, the blocking material has a lowest unoccupied molecular orbital (LUMO) energy level shallower than that of the emissive material. In another embodiment, the blocking material has a highest occupied molecular orbital (HOMO) energy level deeper than that of the emissive material. In one embodiment, the blocking material is selected from the group consisting of 2,2',2"-(1,3,5-benzinetriyl)-tris(1-phenyl-1-H-benzimidazole) (TPBi), bis(2-methyl-8-quinolinolate)-4-(phenylphenolato)aluminium (BAlq), di-[4-(N,N-di-p-tolyl-amino)-phenyl]cyclohexane (TAPC), 9,9'-diphenyl-6-(9-phenyl-9H-carbazol-3-yl)-9H,9'H-3,3'-bicarbazole (Tris-PCz), 1,4-bis(triphenylsilyl)benzene (UGH-2), and 9-(4-tert-butylphenyl)-3,6-bis(triphenylsilyl)-9H-carbazole (CZSi).

In one embodiment, the triplet exciton energy of the transport material is equal to or greater than the triplet exciton energy of the emissive material. In another embodiment, the triplet exciton energy of the transport material is lower than the triplet exciton energy of the emissive material. In another embodiment, the difference between the triplet exciton energy of the transport material and the triplet exciton energy of the emissive material is less than 0.5 eV. In another embodiment, the transport material has a lowest unoccupied molecular orbital (LUMO) energy level shallower than that of the emissive material. In another embodiment, the transport material has a highest occupied molecular orbital (HOMO) energy level deeper than that of the emissive material. In one embodiment, the transport material is selected from the group consisting of N,N'-bis(naphthalen-1-yl)-N,N'-bis(phenyl)-benzidine (NPB), N,N'-bis(3-methylphenyl)-N,N'-bis(phenyl)-benzidine (TPD), di-[4-(N,N-di-p-tolyl-amino)-phenyl]cyclohexane (TAPC), 9,9'-diphenyl-6-(9-phenyl-9H-carbazol-3-yl)-9H,9'H-3,3'-bicarbazole (Tris-PCz), and 4,4'-bis(carbazol-9-yl)biphenyl (CBP). In another embodiment, the transport material is selected from the group consisting of tris(8-hydroxy-quinolinato)aluminium (Alq$_3$), bis(2-methyl-8-quinolinolate)-4-(phenylphenolato)aluminium (BAlq), 2,7-di(2,2'-bipyridin-5-yl)triphenylene (BPy-TP$_2$), and 2,2',2"-(1,3,5-benzinetriyl)-tris(1-phenyl-1-H-benzimidazole) (TPBi).

In one embodiment, the ratio between the blocking material and the transport material is between 3:1 and 1:3. In another embodiment, the ratio between the blocking material and the transport material is about 1:1. In another embodiment, the ratio between the blocking material and the transport material is about 3:1.

In another aspect, the invention relates to an organic light emitting device comprising: a cathode, an anode, a light emitting layer, and an electron blocking layer, wherein the electron blocking layer comprises a blocking material and a transport material. In one embodiment, the device further comprises a hole injection layer, wherein the electron blocking layer is between the light emitting layer and the hole injection layer. In another embodiment, the device further comprising a hole transport layer, wherein the hole transport layer is between the light emitting layer and the hole injection layer. In one embodiment, the blocking material is selected from the group consisting of 2,2',2"-(1,3,5-benzinetriyl)-tris(1-phenyl-1-H-benzimidazole) (TPBi), bis(2-methyl-8-quinolinolate)-4-(phenylphenolato)aluminium (BAlq), di-[4-(N,N-di-p-tolyl-amino)-phenyl]cyclohexane (TAPC), 9,9'-diphenyl-6-(9-phenyl-9H-carbazol-3-yl)-9H,9'H-3,3'-bicarbazole (Tris-PCz), 1,4-bis(triphenylsilyl)benzene (UGH-2), and 9-(4-tert-butylphenyl)-3,6-bis(triphenylsilyl)-9H-carbazole (CZSi). In another embodiment, the transport material is selected from the groups consisting of N,N'-bis(naphthalen-1-yl)-N,N'-bis(phenyl)-benzidine (NPB), N,N'-bis(3-methylphenyl)-N,N'-bis(phenyl)-benzidine (TPD), di-[4-(N,N-di-p-tolyl-amino)-phenyl]cyclohexane (TAPC), 9,9'-diphenyl-6-(9-phenyl-9H-carbazol-3-yl)-9H,9'H-3,3'-bicarbazole (Tris-PCz), and 4,4'-bis(carbazol-9-yl)biphenyl (CBP).

In another aspect, the invention relates to a first device comprising an organic light emitting device comprising an anode, a cathode, and an organic layer, disposed between the anode and the cathode. The organic layer can include a blocking layer comprising a blocking material and a transport material. The first device can be a consumer product, an organic light-emitting device, and/or a lighting panel.

BRIEF DESCRIPTION OF THE DRAWINGS

FIG. 10(a) and FIG. 10(b), is a series of charts depicting the exciton profiles measured via sensing layer technique for a device without a mixed blocking layer (a), and a device with a mixed blocking layer (b). x=0 corresponds to the interface between the emission layer and the hole transport or mixed blocking layer. Black lines depict the measured exciton profiles, blue lines depict the simulated exciton profile from a drift diffusion model, and red lines depict the simulated exciton profile expected from the calculations. The device with a mixed blocking layer shows no exciton density for x<0, whereas the device with no blocking layer shows increasingly severe exciton leakage at with increasing current density, resulting in a loss of efficiency, higher current to achieve the same brightness, and possibly degradation of the hole transport layer materials due to the presence of excitons.

DETAILED DESCRIPTION

Figure 1:
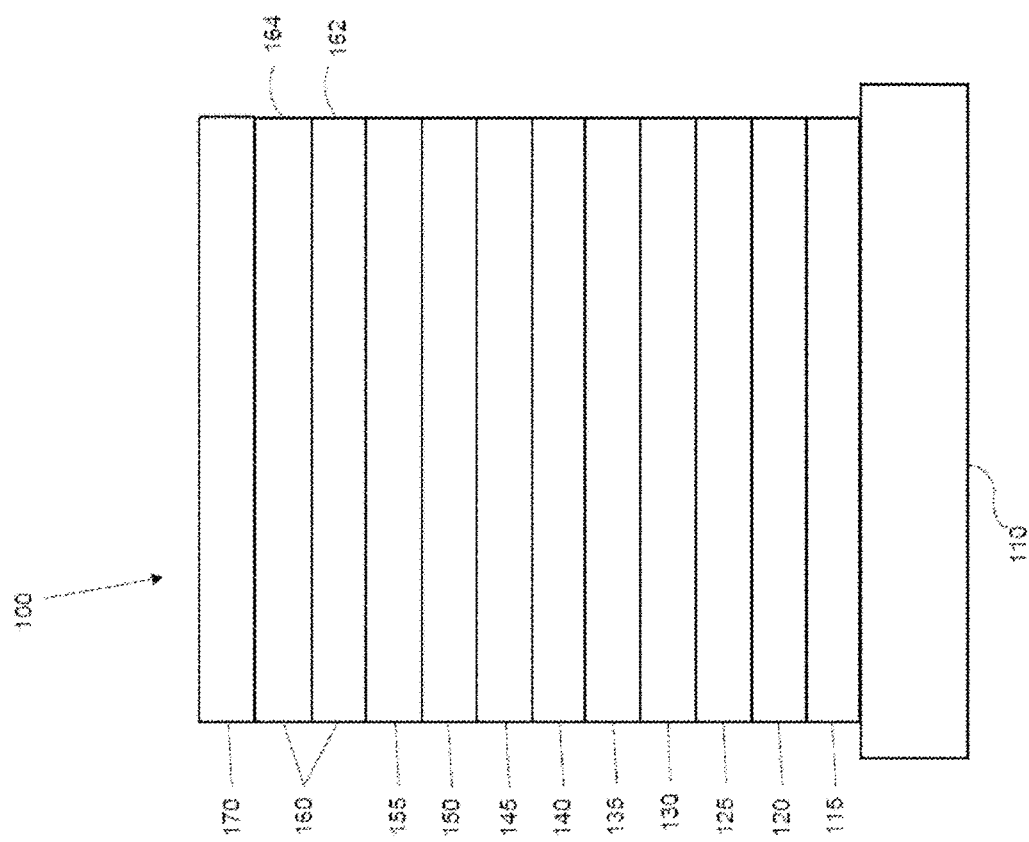
FIG. 1 shows an organic light emitting device.

It is to be understood that the figures and descriptions of the present invention have been simplified to illustrate elements that are relevant for a more clear comprehension of the present invention, while eliminating, for the purpose of clarity, many other elements found in systems and methods relating to mixed blocking layers and devices, such as organic light emitting diodes and other devices, including mixed blocking layers. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
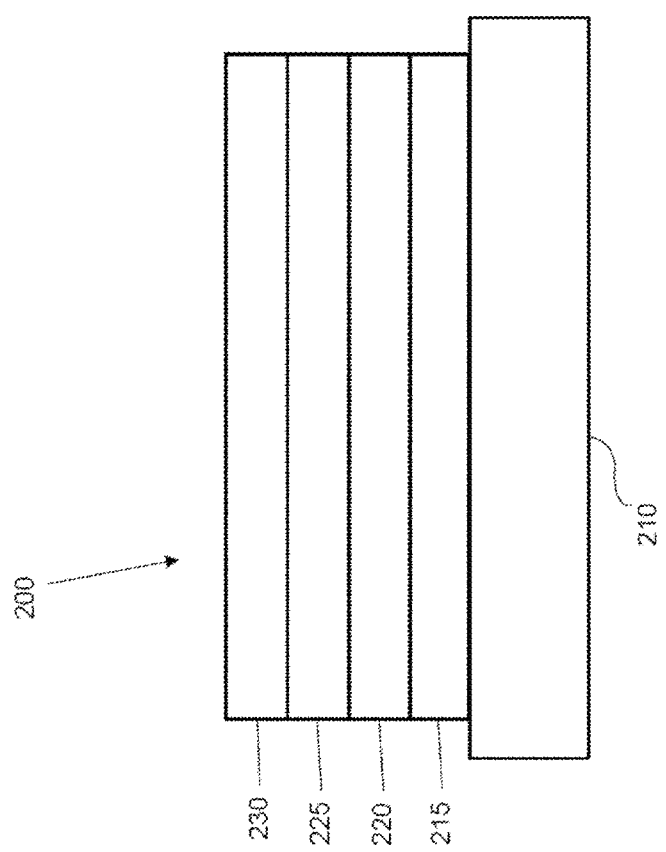
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

In one aspect, the invention relates to a mixed blocking layer structure that addresses the problem of exciton leakage and/or charge leakage out of the emissive region of an organic light emitting device, for example an organic light emitting diode. In various embodiments, a mixed blocking layer of the invention improves exciton confinement to the emissive region (EML), device efficiency, and operational stability of the device. In one embodiment, the blocking layer consists of two or more blended organic materials, i.e., one or more blocking materials, and one or more transport materials. The resulting device stability is improved due to improved efficiency and avoiding degradation of the transport layers resulting from leaked excitons and/or charge carriers.

Mixing the one or more blocking materials, and the one or more transport materials, improves the morphological stability of the blocking layer with advantageous effects to its operational stability. The mixing ratio of the materials should allow for both efficient charge transport and exciton confinement. Non-limiting examples of mixtures include 1:1 and 1:3 conducting to blocking materials; the mixing ratio will vary from system to system depending on material properties of the blocking materials, transport materials, and EML materials.

Any suitable blocking material can be used. In some embodiments, the blocking material can be one or more of 2,2',2"-(1,3,5-benzinetriyl)-tris(1-phenyl-1-H-benzimidazole) (TPBi), bis(2-methyl-8-quinolinolate)-4-(phenylphenolato)aluminium (BAlq), di-[4-(N,N-di-p-tolyl-amino)-phenyl]cyclohexane (TAPC), 9,9'-diphenyl-6-(9-phenyl-9H-carbazol-3-yl)-9H,9'H-3,3'-bicarbazole (Tris-PCz), 1,4-bis(triphenylsilyl)benzene (UGH-2), and 9-(4-tert-butylphenyl)-3,6-bis(triphenylsilyl)-9H-carbazole (CZ Si). In one embodiment, the blocking material is CZSi.

Figure 3:
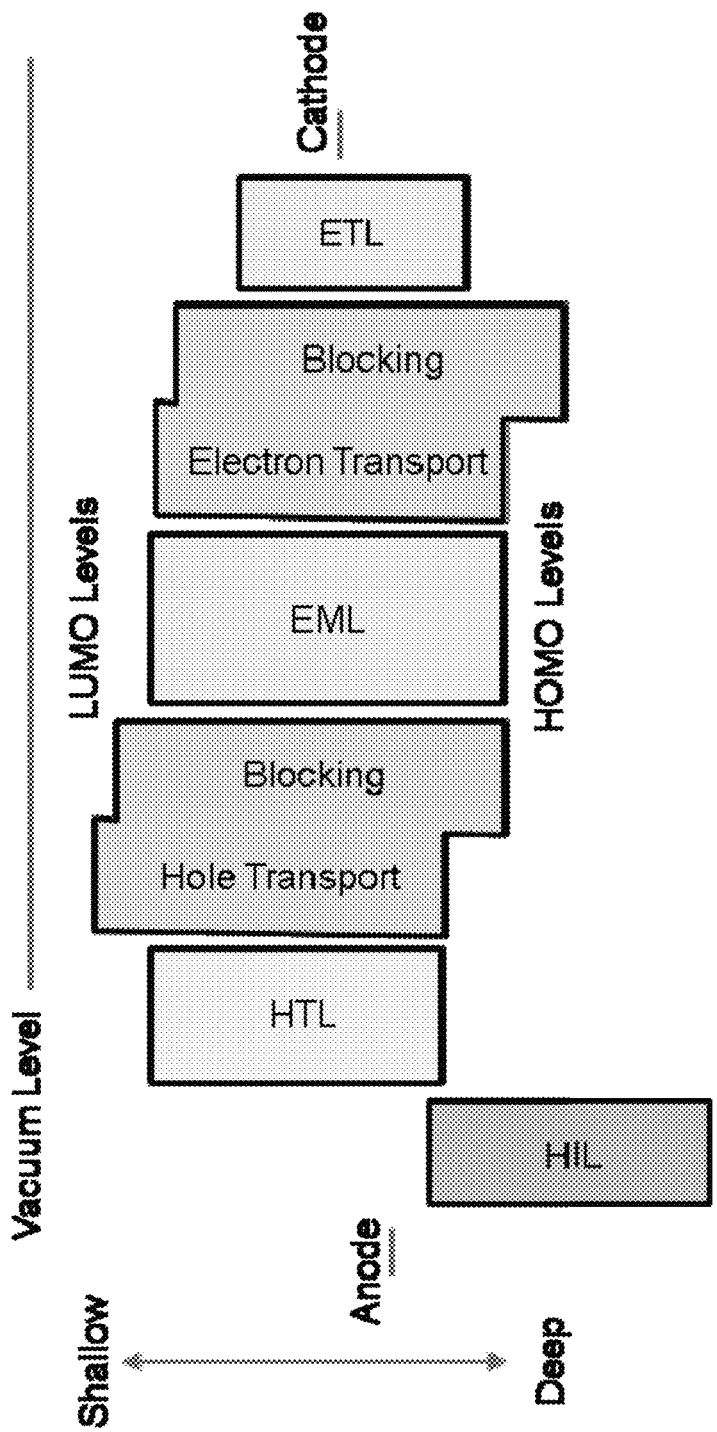
FIG. 3 is a chart depicting the relative HOMO and LUMO energy levels between the respective layers of an exemplary device including a mixed blocking layer.
Figure 4:
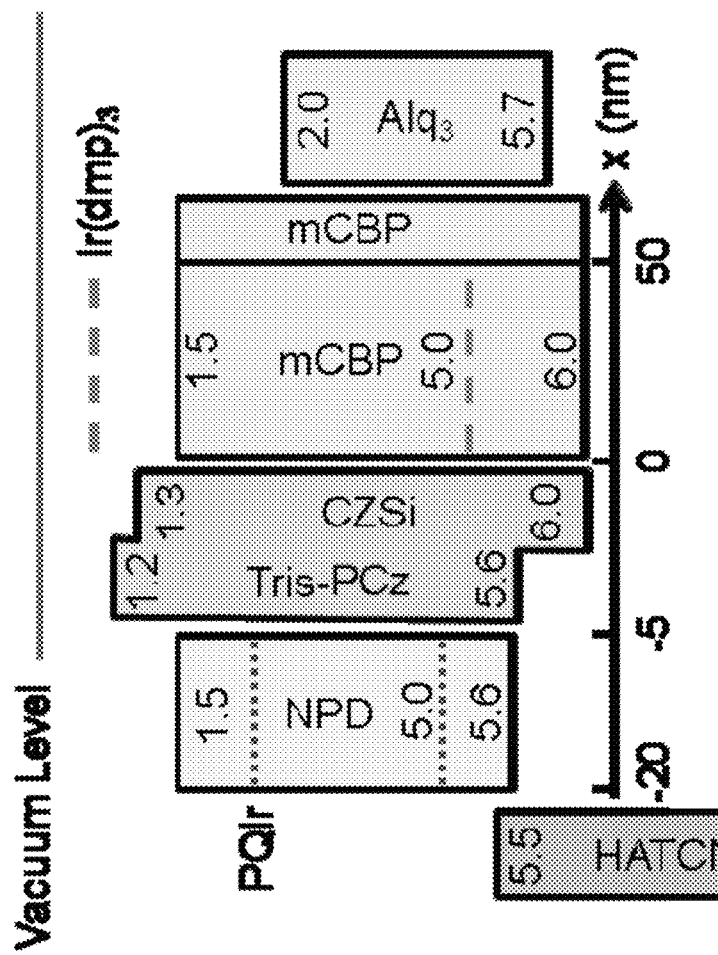
FIG. 4 is a chart depicting the relative and absolute HOMO and LUMO energy levels between various materials included in the respective layers of an exemplary device including a mixed blocking layer, further depicting an embodiment relating to the thickness of the layers.

The triplet exciton energy of the blocking material is preferably greater than that of the emissive molecule in the EML, or greater than that of any EML material, as shown for example in FIGS. 3 and 4. The high triplet energy of the blocking material creates an energetic barrier preventing leakage of triplet excitons formed in the EML from leaking into the adjacent transport layers.

In one embodiment, the blocking material is a hole blocking material. In some embodiments, the triplet exciton energy of the hole blocking material is preferably at least 0.1 eV greater than the triplet energies of the EML materials. In other embodiments, the triplet exciton energy of the hole blocking material is more preferably at least 0.3 eV greater than the triplet energies of the EML materials. In other embodiments, the triplet exciton energy of the hole blocking material is most preferably at least 0.5 eV greater than the triplet energies of the EML materials.

In another embodiment, the blocking material is an electron blocking material. In some embodiments, the triplet exciton energy of the electron blocking material is preferably at least 0.1 eV greater than the triplet energies of the EML materials. In other embodiments, the triplet exciton energy of the electron blocking material is more preferably at least 0.3 eV greater than the triplet energies of the EML materials. In other embodiments, the triplet exciton energy of the electron blocking material is most preferably at least 0.5 eV greater than the triplet energies of the EML materials.

As shown for example in FIG. 4, in one embodiment, the blocking material is CZSi, the emissive molecule in the EML is Ir(dmp)$_3$, and an additional material in the EML is 3,3'-bis(N-carbazolyl)-1,1'-biphenyl (mCBP). The triplet exciton energy of the blocking material CZSi is greater than that of the emissive molecule Ir(dmp)$_3$ in the EML, and greater than that of the additional material mCBP in the EML. In particular, the triplet exciton energy of the blocking material CZ Si is greater than that of the additional material mCBP in the EML by about 0.2 eV.

In some embodiments, the blocking material may have a LUMO energy shallower than that of the EML for blocking layers on the anode side of the EML to act as a charge blocking layer, as shown for example in FIGS. 3 and 4. In some embodiments, the LUMO of the blocking material is preferably not more than 0.3 eV deeper than the LUMO of the hole conducting molecule in the EML. In other embodiments, the LUMO of the blocking material is more preferably not more than 0.1 eV deeper than the LUMO of the hole conducting molecule in the EML. In other embodiments, the LUMO of the blocking material is most preferably greater than the LUMO of the hole conducting molecule in the EML.

In one embodiment, the blocking material is a hole blocking material having a shallower LUMO than that of the EML materials. In one embodiment, as shown for example in FIG. 4, the LUMO of the blocking material CZSi is greater, or shallower, than the LUMO of the hole conducting molecule in the EML. In one embodiment, the hole conducting molecule in the EML is mCBP, and the LUMO of the blocking material CZSi is greater, or shallower, than the LUMO of mCBP by about 0.2 eV.

In other embodiments, the blocking material may have a HOMO energy deeper than that of the EML for blocking layers on the cathode side of the EML to act as a charge blocking layer, as shown for example in FIGS. 3 and 4. In one embodiment, the blocking material is an electron blocking material having a deeper HOMO than that of the EML materials.

In some embodiments, the HOMO of the blocking material is preferably not more than 0.3 eV shallower than the HOMO of the electron conducting molecule in the EML. In other embodiments, the HOMO of the blocking material is more preferably not more than 0.1 eV shallower than the HOMO of the electron conducting molecule in the EML. In other embodiments, the HOMO of the blocking material is most preferably deeper than the HOMO of the electron conducting molecule in the EML. In one embodiment, as shown for example in FIG. 4, the HOMO of the blocking material CZSi is about equal to the HOMO of the hole conducting molecule in the EML.

The transport material is suitable for charge transport and injection into the EML as well as having a high triplet energy. For the transport material, a high triplet energy means comparable to the triplet energy of the emissive molecule in the EML but not necessarily higher. The favorable conduction properties of the transport material facilitate good injection, conductivity, and improved power efficiency of the device without constraint on the frontier orbitals of the blocker. The high triplet energy of the transport material minimize losses due to energy transfer from the EML.

In some embodiments, the transport material may have a LUMO energy shallower than that of the EML for blocking layers on the anode side of the EML to act as a charge blocking layer. In some embodiments, the transport material is a hole transport material. The hole transport material can be one or more of N,N'-bis(naphthalen-1-yl)-N,N'-bis(phenyl)-benzidine (NPB), N,N'-bis(3-methylphenyl)-N,N'-bis(phenyl)-benzidine (TPD), di-[4-(N,N-di-p-tolyl-amino)-phenyl]cyclohexane (TAPC), 9,9'-diphenyl-6-(9-phenyl-9H-carbazol-3-yl)-9H,9'H-3,3'-bicarbazole (Tris-PCz), and 4,4'-bis(carbazol-9-yl)biphenyl (CBP). In one embodiment, the hole transport material is Tris-PCz.

In some embodiments, the triplet exciton energy of the hole transport material is preferably not more than 0.5 eV below the triplet energies of the EML materials. In other embodiments, the triplet exciton energy of the hole transport material is more preferably not more than 0.3 eV below the triplet energies of the EML materials. In other embodiments, the triplet exciton energy of the hole transport material is most preferably equal to or greater than the triplet energies of the EML materials.

As shown for example in FIG. 4, in one embodiment, the hole transport material is Tris-PCz, the emissive molecule in the EML is Ir(dmp)$_3$, and an additional material in the EML is mCBP. The triplet exciton energy of the transport material Tris-PCz is greater than that of the emissive molecule Ir(dmp)$_3$ in the EML, and barely lower than that of the additional material mCBP in the EML, by just 0.1 eV.

In some embodiments, the hole transport material HOMO is preferably less than 0.5 eV different from the HOMO of the hole conducting molecule in the EML. In other embodiments, the hole transport material HOMO is more preferably less than 0.3 eV different from the HOMO of the hole conducting molecule in the EML. In other embodiments, the hole transport material HOMO is most preferably less than 0.1 eV different from the HOMO of the hole conducting molecule in the EML.

As shown for example in FIG. 4, in one embodiment, the transport material is Tris-PCz, and the hole transport material in the EML is mCBP. The HOMO of the transport material Tris-PCz is greater than the HOMO of the hole transport material mCBP in the EML. In particular, the HOMO of the transport material Tris-PCz is greater than that of the hole transport material mCBP in the EML by about 0.4 eV.

In some embodiments, the hole transport material LUMO is preferably not more than 0.3 eV deeper than the LUMO of the electron conducting molecule in the EML. In other embodiments, the hole transport material LUMO is more preferably not more than 0.1 eV deeper than the LUMO of the electron conducting molecule in the EML. In other embodiments, the hole transport material LUMO is most preferably greater than the LUMO of the electron conducting molecule in the EML.

As shown for example in FIG. 4, in one embodiment, the transport material is Tris-PCz, and the transport material in the EML is mCBP. The LUMO of the transport material Tris-PCz is greater than that of the transport material mCBP in the EML. In particular, the LUMO of the transport material Tris-PCz is greater than that of the transport material mCBP in the EML by about 0.3 eV.

In other embodiments, the transport material may have a HOMO energy deeper than that of the EML for blocking layers on the cathode side of the EML to act as a charge, or electron, blocking layer. In some embodiments, the transport material is an electron transport material. The electron transport material can be one or more of tris(8-hydroxyquinolinato)aluminium ($Alq_3$), bis(2-methyl-8-quinolinolate)-4-(phenylphenolato)aluminium (BAlq), 2,7-di(2,2'-bipyridin-5-yl)triphenylene ($BPy-TP_2$), and 2,2',2"-(1,3,5-benzinetriyl)-tris(1-phenyl-1-H-benzimidazole) (TPBi).

In some embodiments, the triplet exciton energy of the electron transport material is preferably not more than 0.5 eV below the triplet energies of the EML materials. In other embodiments, the triplet exciton energy of the electron transport material is more preferably not more than 0.3 eV below the triplet energies of the EML materials. In other embodiments, the triplet exciton energy of the electron transport material is most preferably equal to or greater than the triplet energies of the EML materials.

In some embodiments, the electron transport material LUMO is preferably less than 0.5 eV different from the LUMO of the electron conducting molecule in the EML. In other embodiments, the electron transport material LUMO is more preferably less than 0.3 eV different from the LUMO of the electron conducting molecule in the EML. In other embodiments, the electron transport material LUMO is most preferably less than 0.1 eV different from the LUMO of the electron conducting molecule in the EML.

In some embodiments, the electron transport material HOMO is preferably not more than 0.3 eV shallower than the HOMO of the hole conducting molecule in the EML. In other embodiments, the electron transport material HOMO is more preferably not more than 0.1 eV shallower than the HOMO of the hole conducting molecule in the EML. In other embodiments, the electron transport material HOMO is most preferably deeper than the HOMO of the hole conducting molecule in the EML.

A mixed blocking layer of the invention has a variable spatial disposition relative to an emissive layer in an organic light emitting device. In some embodiments, the mixed blocking layer is disposed between an emissive layer and a charge injection layer. In one embodiment, the mixed blocking layer is an electron blocking layer, disposed between an emissive layer and hole injection layer. In another embodiment, the mixed blocking layer is a hole blocking layer disposed between an emissive layer and an electron injection layer.

Figure 5:
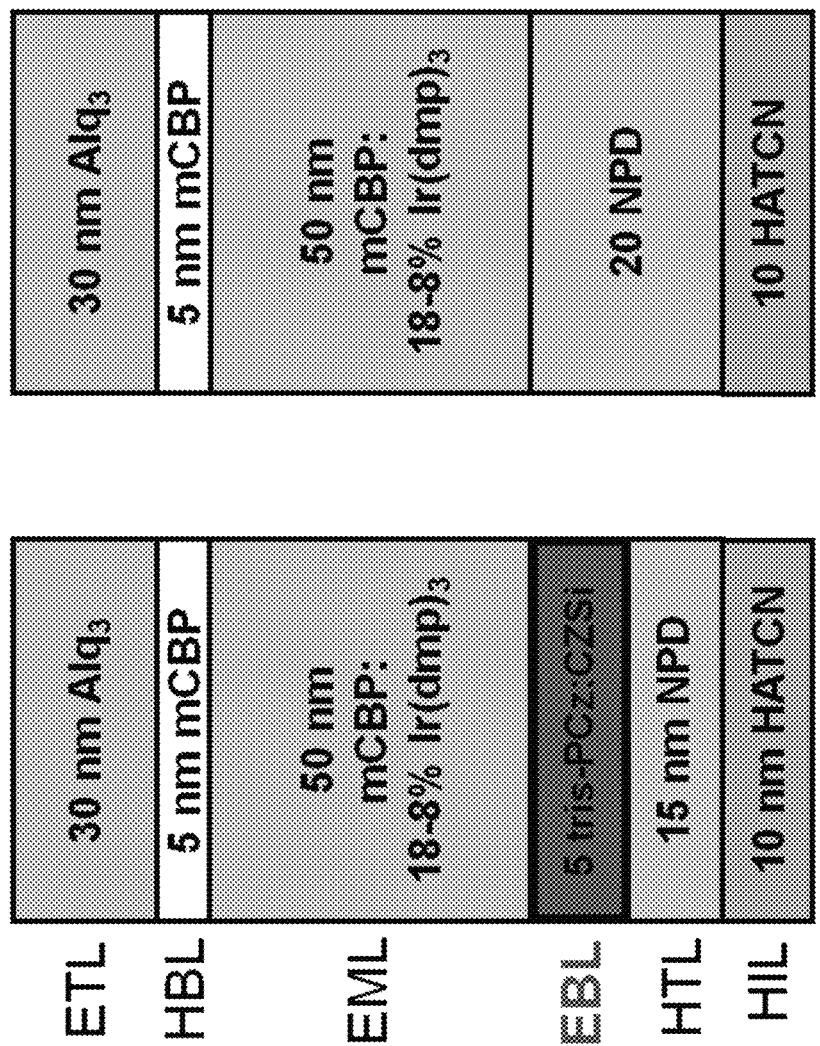
FIG. 5 is a schematic depiction of the organic stack for the exemplary devices. The device on the left includes the mixed blocking layer. The device on the right is the reference device, and omits the mixed blocking layer.

In one embodiment, as shown for example in FIG. 5, an electron mixed blocking layer comprising blocking material CZSi and transport material Tris-PCz, is disposed between a hole transport layer and the EML. As readily apparent, an electron mixed blocking layer of the invention can also be disposed between the hole transport layer and the hole injection layer.

Optional charge transport layers, e.g., hole transport layers and electron transport layers, can also have variable spatial dispositions relative to the mixed blocking layer(s) and emissive layer(s). In one embodiment, a charge transport layer can be disposed between a mixed blocking layer and an emissive layer. In another embodiment, a charge transport layer can be disposed between a mixed blocking layer and a charge injection layer.

A mixed blocking layer of the invention has a variable thickness. In some embodiments, the mixed blocking layer is between 5 and 20 nm thick. In some embodiments, the mixed blocking layer is about 5 nm thick.

Experimental

An exemplary device having improved efficiency, lifetime, and energy confinement over a reference device without a mixed blocking layer has been constructed. FIG. 5 depicts the structure of the organic stack used for the exemplary device. The full structure of the reference device is 70 nm ITO/10 nm HAT-CN/20 nm NPD/50 nm EML/5 nm mCBP/30 nm Alga/1.5 nm LiQ/100 nm Al. [Zhang et al., 2014, Nature Communications 5:5008]. The full structure of the exemplary device incorporating a mixed blocking layer is 70 nm ITO/10 nm HAT-CN/15 nm NPD/5 nm Tris-PCz: CZSi (1:1 or 1:3 by volume)/50 nm EML/5 nm mCBP/30 nm Alga/1.5 nm LiQ/100 nm Al. The EML layer is composed of the host mCBP and dopant $Ir(dmp)_3$, which is linearly graded from 18% (v/v) on the anode (ITO) side to 8% on the cathode side. The device was fabricated using vacuum thermal deposition. The organic layers, with the exception of NPD and Tris-PCz:CZSi, were grown simultaneously without breaking vacuum.

Figure 6:
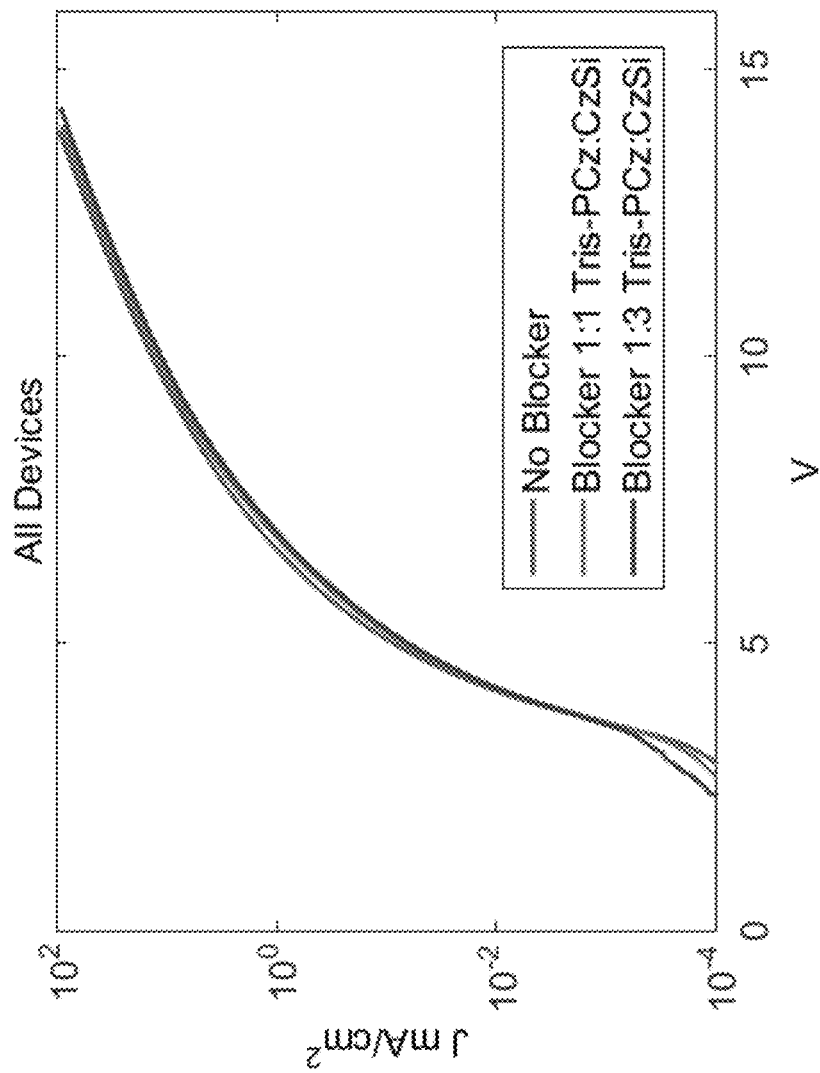
FIG. 6 is a chart depicting the JV characteristics for devices without a blocking layer, with a 1:1 mixed ratio blocking layer, and with a 1:3 mix ratio blocking layer, respectively, showing conductivity decreasing slightly with the inclusion of the blocking layer and with increased blocker concentration in the blocking layer.
Figure 7:
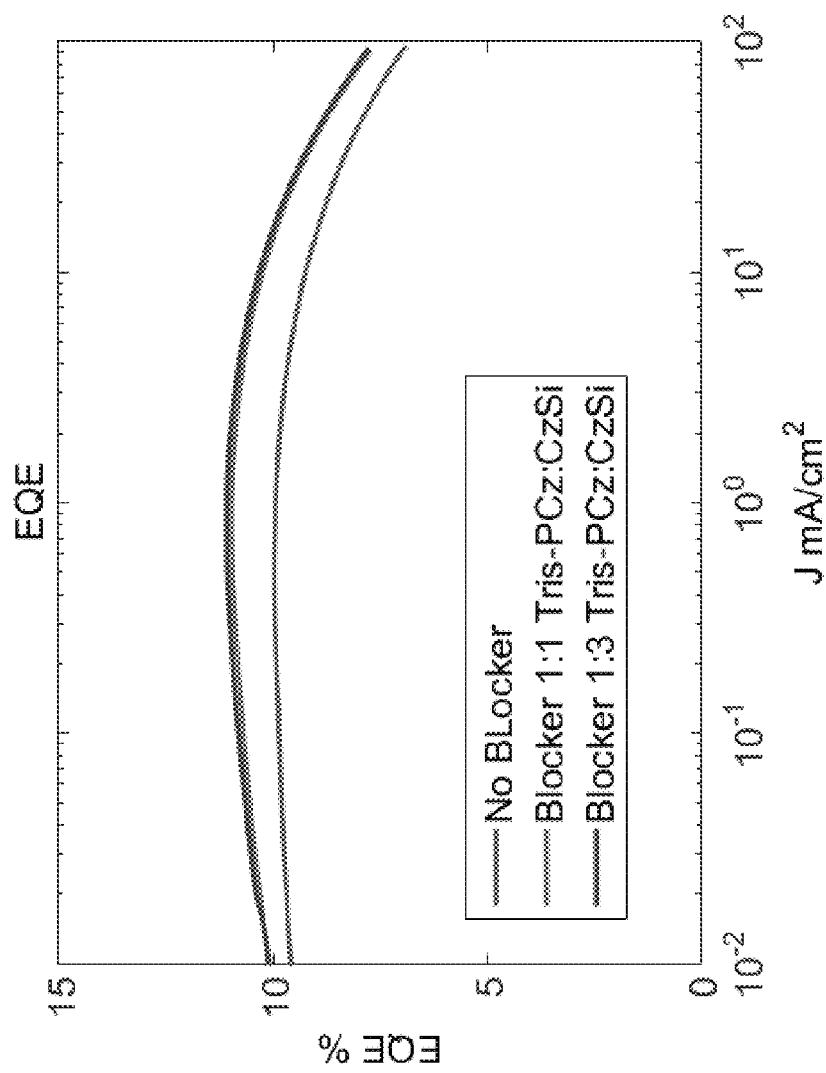
FIG. 7 is a chart depicting the EQE characteristics for devices without a blocking layer, with a 1:1 mixed ratio blocking layer, and with a 1:3 mix ratio blocking layer, respectively, showing improved efficiency with the inclusion of the blocking layer.
Figure 8:
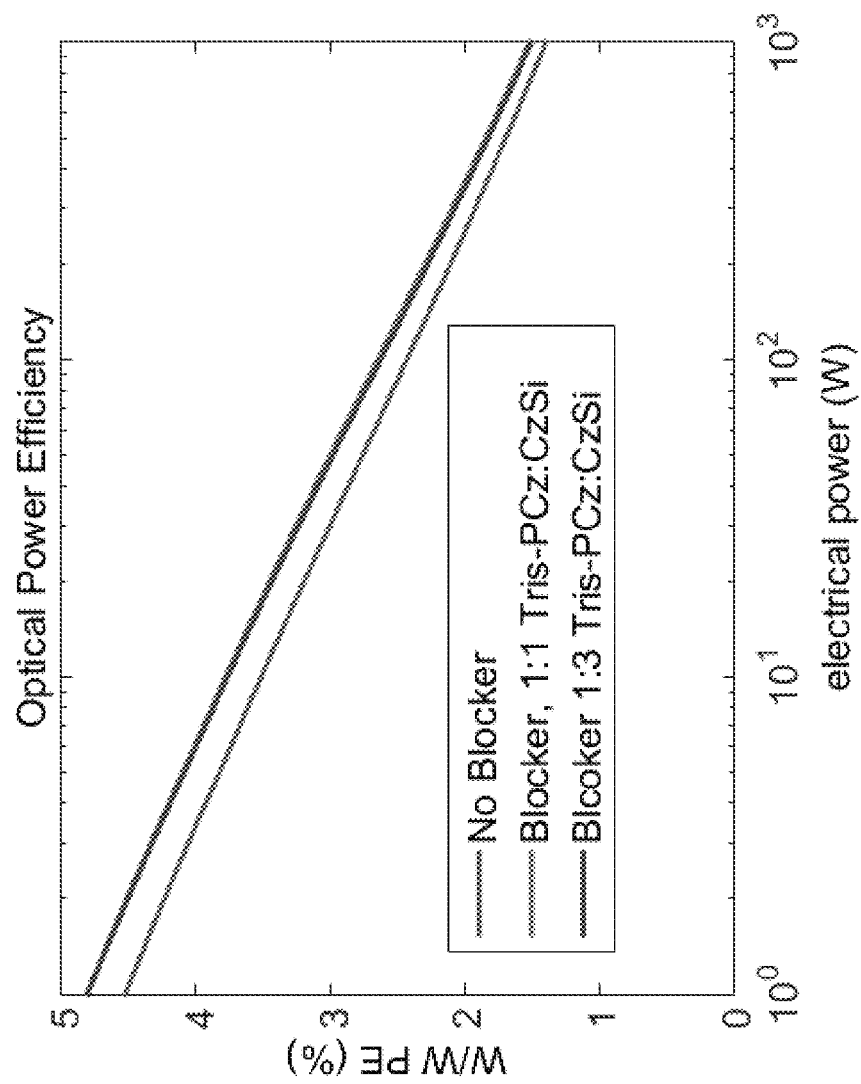
FIG. 8 is a chart depicting the power efficiency characteristics for devices without a blocking layer, with a 1:1 mixed ratio blocking layer, and with a 1:3 mix ratio blocking layer, respectively, showing improved power efficiency of the device with inclusion of the blocking layer.
Figure 9:
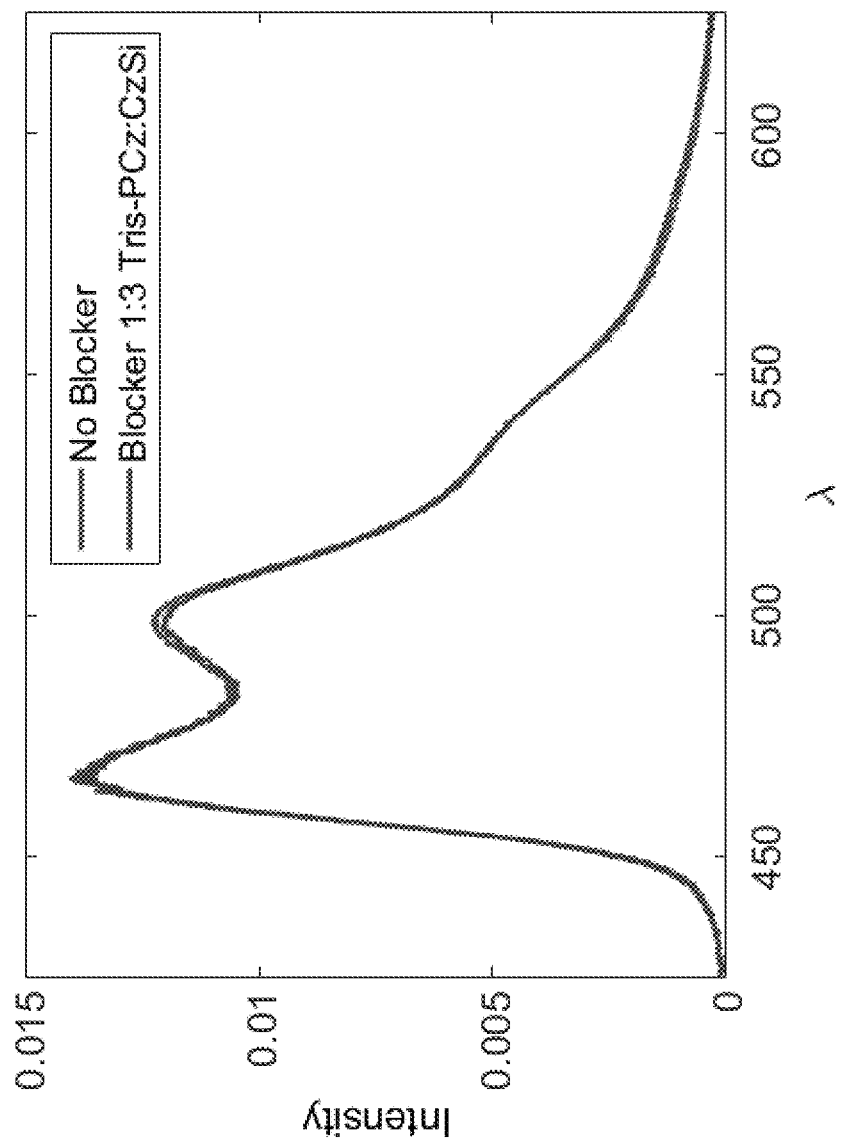
FIG. 9 is a chart depicting the EL emission spectrum for devices without a blocking layer, and with a 1:3 mix ratio blocking layer, respectively, showing nearly identical spectra of the device with and without the blocking layer.
Figure 10:
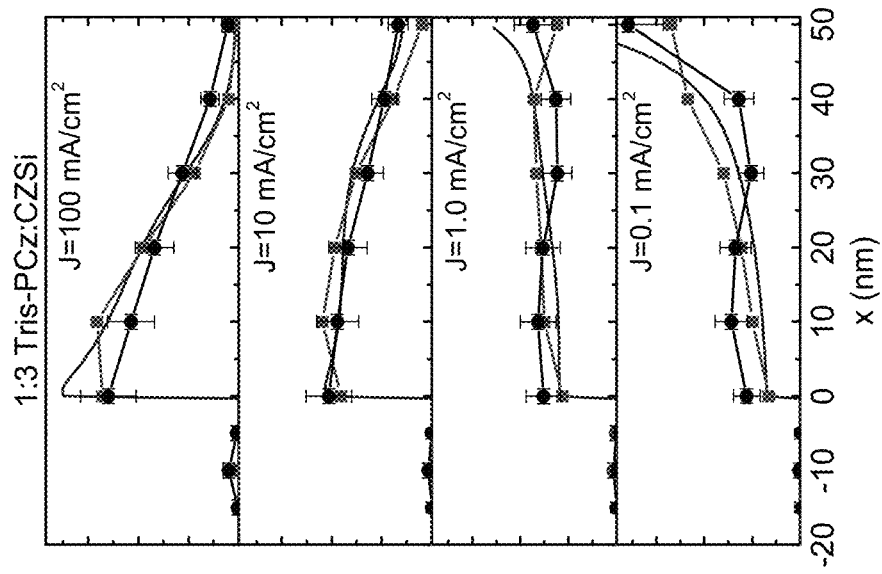
FIG. 10, comprising
Figure 10:
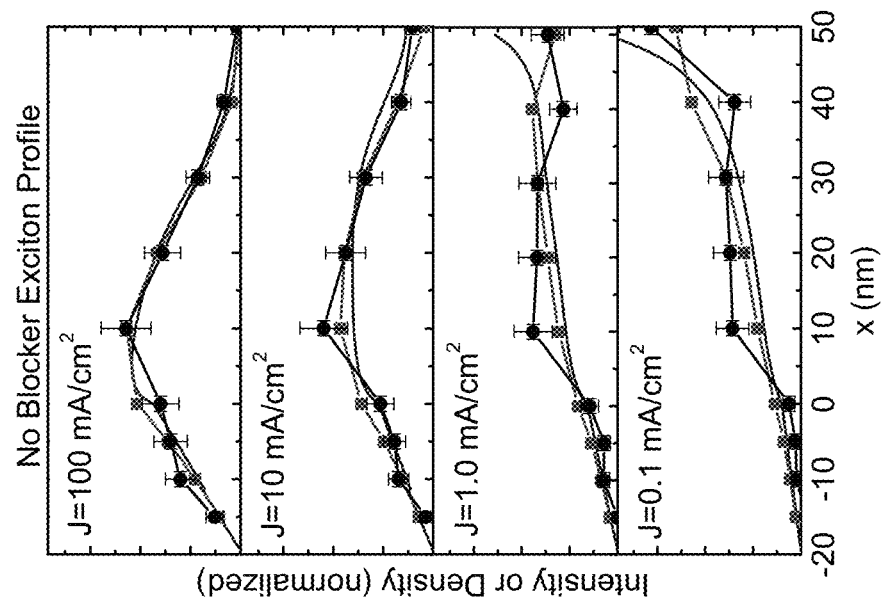
Figure 11:
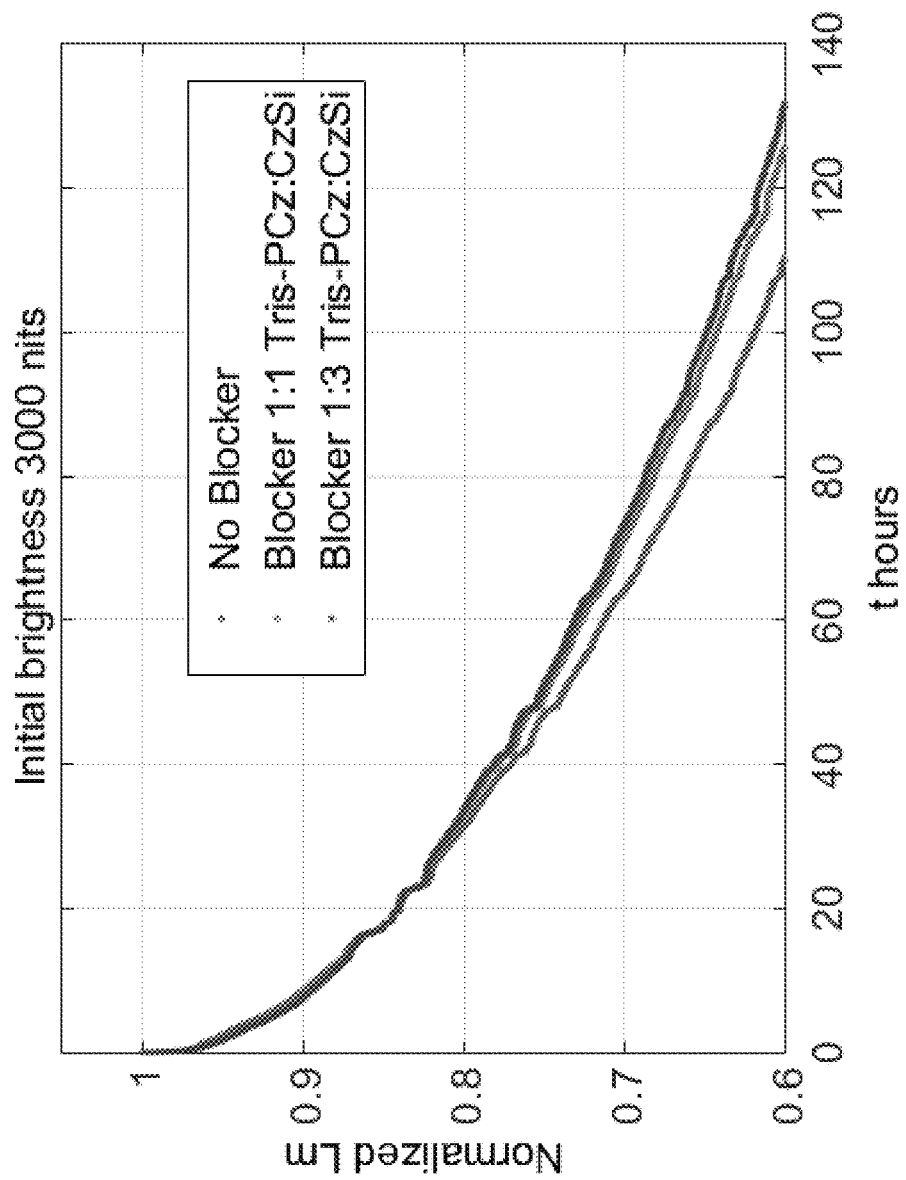
FIG. 11 is a chart depicting the lifetime luminance characteristics for devices without a blocking layer, with a 1:1 mixed ratio blocking layer, and with a 1:3 mix ratio blocking layer, respectively, showing improved lifetime with the inclusion of the blocking layer.
Figure 12:
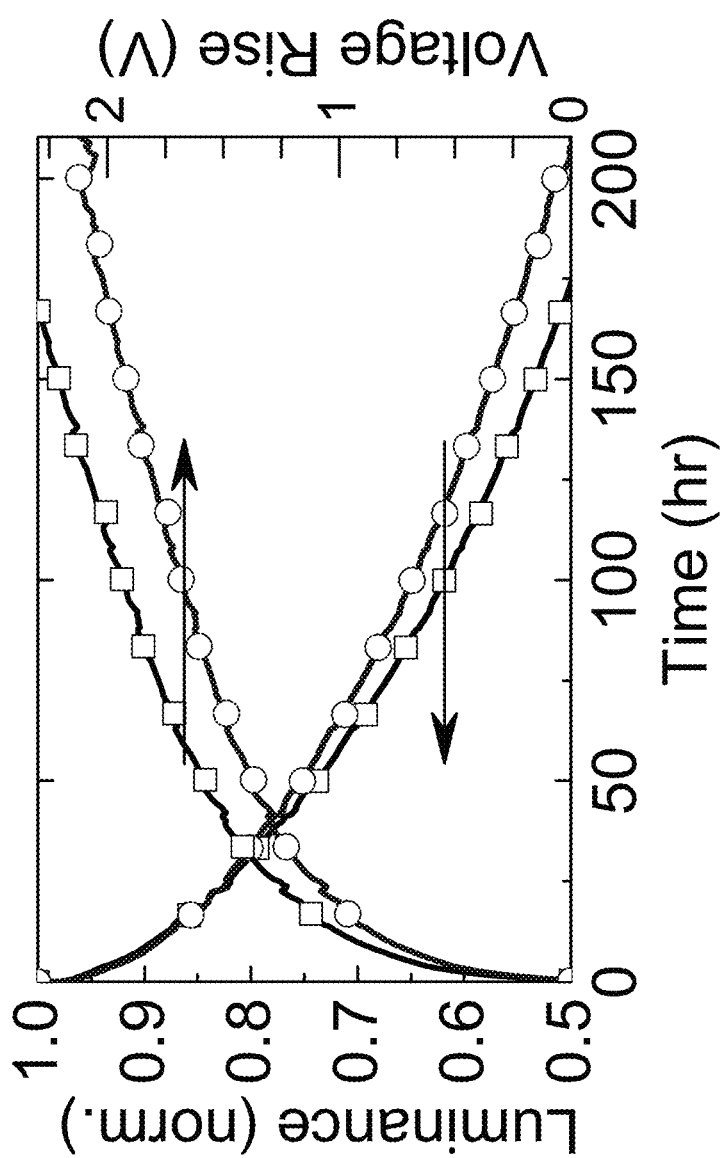
FIG. 12 is a chart depicting the average lifetime luminance characteristics averaged for devices without a blocking layer, and with a 1:3 mix ratio blocking layer, respectively, showing improved lifetime and reduced voltage rise with the inclusion of the blocking layer. The lifetime tests were performed for an initial luminance of 3,000 nits.
Figure 13:
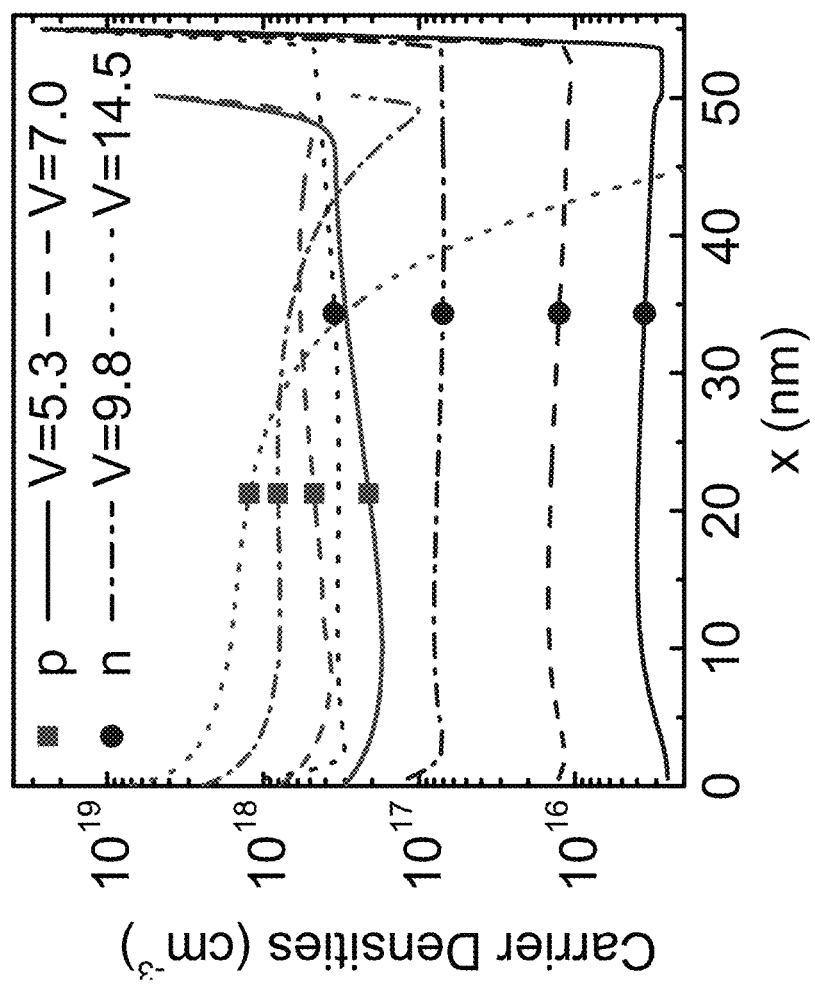
FIG. 13 is a chart depicting simulated Polaron densities at the voltages corresponding to 0.1, 1.0, 10, and 100 mA/cm$^2$. Holes are blocked by a blocking layer (HBL) at x=50 nm and electrons are blocked at the anode side of the emission layer (EML) at x=0 nm. The electron current is reduced by the energy barrier at the HBL/electron transport layer (ETL) interface at x=55 nm. At low voltage, holes (solid line, squares) build up at the HBL/ETL interface, while electrons build up at the ETL/HBL interface, with a low injected electron density in the EML. As the applied voltage increases, the barrier height to electron injection into the HBL decreases and electrons penetrate deeper into the EML.
Figure 14:
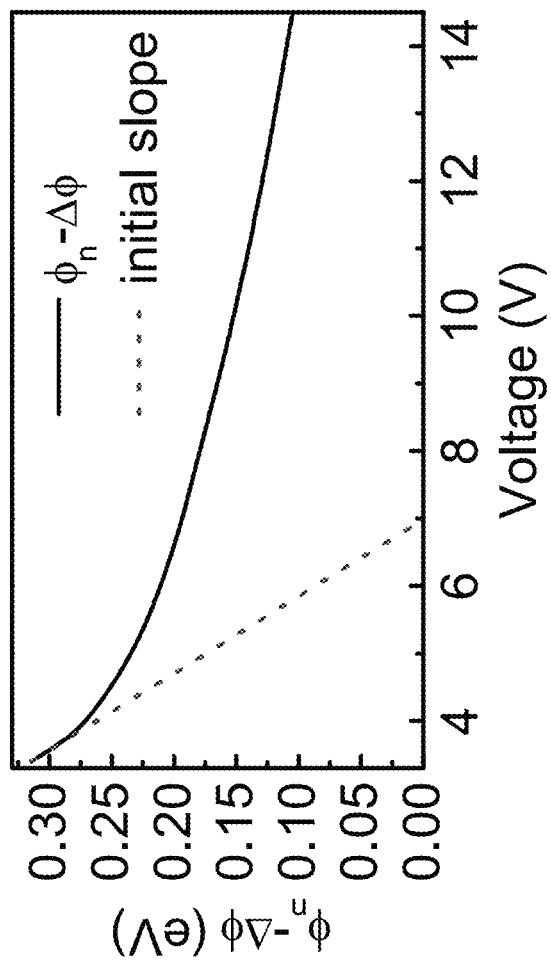
FIG. 14 is a chart depicting the electron injection barrier height at the mCBP:Alq$_3$ (located at x=50 nm) interface, adjusted by the electric field across the layer. As electrons are injected into the EML, negative space charge decreases the barrier height. The slope of the dotted line shows the initial rate of barrier reduction.

FIG. 6 depicts the current voltage characteristics of the reference and blocking devices, showing an almost unchanged conductivity with the inclusion of the blocking layer. FIG. 7 depicts the increase in efficiency from the reference with the inclusion of the mixed blocking layer structure. FIG. 8 depicts the corresponding power efficiency increase. The spectrum of the devices is the same, as shown in FIG. 9. FIG. 10 depicts the exciton density distribution calculated from a sensing layer technique. The sensing layers were 2 nm thick and, in addition to the normal device composition at the location of the sensing layer, were doped with 3% of the red phosphor iridium (III) bis(2-phenyl quinolyl-N,C20) acetylacetonate (PQIr). The exciton density at the position of the sensing layer was then calculated based on the outcoupling and quantum yield of PQIr in a given position. Next, improved luminescence lifetime is shown for the device incorporating the mixed blocking layer of different mixing ratios in FIG. 11. Statistical data for the lifetime of the reference device and the 1:3 Tris-PCz:CZSi blocking layer device are shown in FIG. 12. The device with the blocking layer shows increased lifetime and reduced voltage rise. FIGS. 13 and 14 depict the calculated Polaron densities from the simulation corresponding to the exciton profiles given in FIG. 10. [Coburn et al., 2016, Advanced Optical Materials 4:889].

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting. The disclosures of each and every patent, patent application, and publication cited herein are hereby incorporated herein by reference in their entirety.

We claim:

1. An organic light emitting device comprising:
a cathode, an anode, and an organic light emission layer disposed between an electron transport layer and a non-emissive hole transport layer;
the light emission layer comprising an emissive material; and
a mixed electron blocking layer consisting of an electron blocking material and a first transport material, the mixed electron blocking layer positioned between the light emission layer and the hole transport layer such that the mixed electron blocking layer is in direct contact with the light emission layer and the hole transport layer;
wherein the blocking material has a lowest unoccupied molecular orbital (LUMO) energy level shallower than that of the LUMO energy level of the emissive material, and a volume ratio between the blocking material and the first transport material is between 3:1 and 1:3;
wherein at least one of the electron blocking material and the first transport material is an organic compound;
wherein the mixed electron blocking layer is in direct contact with a single light emission layer;
wherein the hole transport layer has a uniform composition and is in direct contact with a non-emissive hole injection layer; and
wherein the hole injection layer has a uniform composition and is in direct contact with the anode.

2. The organic light emitting device of claim 1, wherein the blocking material has a highest occupied molecular orbital (HOMO) energy level deeper than that of the HOMO energy level of the emissive material.

3. The organic light emitting device of claim 1, wherein the blocking material is selected from the group consisting of 2,2',2"-(1,3,5-benzinetriyl)-tris(1-phenyl-1-H-benzimidazole) (TPBi), di-[4-(N,N-di-p-tolyl-amino)-phenyl]cyclohexane (TAPC), 9,9'-diphenyl-6-(9-phenyl-9H-carbazol-3-yl)-9H,9'H-3,3'-bicarbazole (Tris-PCz), 1,4-bis(triphenylsilyl)benzene (UGH-2), and 9-(4-tert-butylphenyl)-3,6-bis(triphenylsilyl)-9H-carbazole (CZSi).

4. The organic light emitting device of claim 1, wherein the triplet exciton energy of the first transport material is equal to or greater than the triplet exciton energy of the emissive material.

5. The organic light emitting device of claim 1, wherein the triplet exciton energy of the first transport material is lower than the triplet exciton energy of the emissive material.

6. The organic light emitting device of claim 5, wherein the difference between the triplet exciton energy of the first transport material and the triplet exciton energy of the emissive material is less than 0.5 eV.

7. The organic light emitting device of claim 1, wherein the first transport material has a lowest unoccupied molecular orbital (LUMO) energy level shallower than that of the LUMO energy level of the emissive material.

8. The organic light emitting device of claim 1, wherein the first transport material has a highest occupied molecular orbital (HOMO) energy level deeper than that of the HOMO energy level of the emissive material.

9. The organic light emitting device of claim 1, wherein the first transport material is selected from the group consisting of N,N'-bis(naphthalen-1-yl)-N,N'-bis(phenyl)-benzidine (NPB), N,N'-bis(3-methylphenyl)-N,N'-bis(phenyl)-benzidine (TPD), di-[4-(N,N-di-p-tolyl-amino)-phenyl]cyclohexane (TAPC), 9,9'-diphenyl-6-(9-phenyl-9H-carbazol-3-yl)-9H,9'H-3,3'-bicarbazole (Tris-PCz), and 4,4'-bis(carbazol-9-yl)biphenyl (CBP).

10. The organic light emitting device of claim 1, wherein the first transport material is selected from the group consisting of tris(8-hydroxy-quinolinato)aluminium ($Alq_3$), bis(2-methyl-8-quinolinolate)-4-(phenylphenolato)aluminium (BAlq), 2,7-di(2,2'-bipyridin-5-yl)triphenylene ($BPy-TP_2$), and 2,2',2"-(1,3,5-benzinetriyl)-tris(1-phenyl-1-H-benzimidazole) (TPBi).

11. The organic light emitting device of claim 1, wherein the ratio between the blocking material and the first transport material is about 1:1.

12. The organic light emitting device of claim 1, wherein the ratio between the blocking material and the first transport material is about 3:1.

13. The organic light emitting device of claim 1, wherein the emissive material is $Ir(dmp)_3$.

14. The organic light emitting device of claim 13, wherein the $Ir(dmp)_3$ is linearly graded in the light emission layer.

15. The organic light emitting device of claim 1, wherein the electron blocking layer has a thickness from 5 nm to 20 nm.

16. The organic light emitting device of claim 1, further comprising a mixed hole blocking layer consisting of a hole blocking material and a second transport material, the mixed hole blocking layer positioned between the light emissive layer and the electron transport layer.

17. The organic light emitting device of claim 16, wherein the hole blocking material comprises CZSi.

* * * * *